United States Patent
De Boet et al.

(10) Patent No.: US 8,450,802 B2
(45) Date of Patent: May 28, 2013

(54) LDMOS HAVING A FIELD PLATE

(75) Inventors: Johannes Adrianus Maria De Boet, Beuningen (NL); Henk Jan Peuscher, Wijchen (NL); Paul Bron, Grave (NL); Stephan Jo Cecile Henri Theeuwen, Nijmegen (NL)

(73) Assignee: NXP B.V., Eindhoven (NL)

( * ) Notice: Subject to any disclaimer, the term of this patent is extended or adjusted under 35 U.S.C. 154(b) by 103 days.

(21) Appl. No.: 13/054,647

(22) PCT Filed: Jul. 20, 2009

(86) PCT No.: PCT/IB2009/053140
§ 371 (c)(1),
(2), (4) Date: Jan. 18, 2011

(87) PCT Pub. No.: WO2010/010506
PCT Pub. Date: Jan. 28, 2010

(65) Prior Publication Data
US 2011/0121389 A1    May 26, 2011

(30) Foreign Application Priority Data
Jul. 22, 2008 (EP) .................................. 08160869

(51) Int. Cl.
*H01L 29/066* (2006.01)
(52) U.S. Cl.
USPC .................................. 257/343; 257/E29.201
(58) Field of Classification Search
USPC .......................................... 257/343, E29.261
See application file for complete search history.

(56) References Cited

U.S. PATENT DOCUMENTS

| | | |
|---|---|---|
| 7,109,562 B2 | 9/2006 | Lee |
| 2008/0237705 A1 * | 10/2008 | Theeuwen et al. ............ 257/343 |

FOREIGN PATENT DOCUMENTS

| | | |
|---|---|---|
| EP | 1 465 260 A2 | 10/2004 |
| EP | 1467411 A2 | 10/2004 |
| WO | 2007/017803 A2 | 2/2007 |
| WO | 2007/052196 A1 | 5/2007 |

OTHER PUBLICATIONS

Fujishima, N., et al. "A 700V Lateral Power MOSFET with Narrow Gap Double Metal Field Plates Realizing Low On-resistance and Long-term Stability of Performance", Proc. of 2001 Int'l Symp. on Power Semiconductor Devices & ICs, Osaka, JP, IEEE, pp. 255-258 (Jun. 2001).
Van Rijs, F., et al "Efficiency Improvement of LDMOS Transistors for Base Stations: Towards the Theoretical Limit", Int'l. Electron Devices Meeting, IEDM 2006, 4 pgs. (2006).
International Search Report and Written Opinion for International Patent Application PCT/IB2009/053140 (Nov. 9, 2009).

* cited by examiner

*Primary Examiner* — Howard Weiss
*Assistant Examiner* — Steven Rao

(57) ABSTRACT

Laterally diffused metal oxide semiconductor transistor for a radio frequency-power: amplifier comprising a drain finger (25,27) which drain finger is connected to a stack of one or more metal interconnect layers, (123,61,59,125) wherein a metal interconnect layer (123) of said stack is connected to a drain region (25) on the substrate, wherein said stack comprises a field plate (123, 125, 121) adapted to reduce the maximum magnitude of the electric field between the drain and the substrate and overlying the tip of said drain finger.

15 Claims, 5 Drawing Sheets

LDMOS HAVING A FIELD PLATE

FIELD OF THE INVENTION

The invention relates to a transistor for a radio frequency power amplifier.

BACKGROUND OF THE INVENTION

In base stations for personal communications systems, for example used for the Global System for Mobile communications (GSM), Enhanced Data Rates for GSM Evolution (EDGE), Wideband Code Division Multiple Access (W-CDMA), radio frequency (RF) power amplifiers are among the key components. For these power amplifiers, RF power laterally diffused metal oxide semiconductor (LDMOS) transistors are a commonly used technology. They exhibit excellent high power capabilities, gain and linearity. These metal oxide semiconductor (MOS) transistors are not only used in base stations but also in radar and broadcast applications. If a RF mismatch occurs at the output of the LDMOS, power will be reflected back at the LDMOS and the LDMOS must be able to handle this. Thus ruggedness, i.e. the capacity to sink excess energy without damage, is an important issue for RF power LDMOS transistors. For low-frequency applications, ruggedness can be improved by adding external diodes with appropriate breakdown voltages. The diodes will sink electrical energy and thus prevent damage to the LDMOS. For RF LDMOS transistors with high frequency applications, external diodes would degrade the RF performance and the ruggedness improvement would be insufficient. It is also conceivable to sink electrical energy through the drain to substrate diode, if the drain-substrate diode is able to sink enough energy before the voltage reaches a level at which the parasitic bipolar transistor is turned on and the LDMOS is damaged. However, the breakdown often starts locally in a specific section of the drain, which determines a low breakdown voltage but doesn't give a high breakdown current.

It is therefore an object of the invention to improve a laterally diffused metal oxide semiconductor circuit for a radio frequency power amplifier in a way that allows the adjusting of a breakdown voltage at which breakdown will occur with a higher breakdown current.

SUMMARY OF THE INVENTION

According to the present invention there is provided a laterally diffused metal oxide semiconductor transistor for a radio frequency power amplifier comprising a drain finger, which drain finger comprises a stack of one or more metal interconnect layers, wherein a metal interconnect layer of the stack of one or more metal interconnect layers is connected to a drain region on the substrate, characterized in that the tip of the drain finger comprises a field plate adapted to reduce the maximum magnitude of the electric field between the drain and the substrate.

The LDMOS transistor may comprise an epitaxial layer over a substrate. The epitaxial layer may be the highest layer of the substrate comprising pre-doped Silicon. The LDMOS transistor may comprise a source region and a drain region within the epitaxial layer, which source region and drain region may be mutually connected through a channel region. The LDMOS transistor may further comprise a gate electrode on top of the epitaxial layer for influencing an electron distribution in the channel region. It may be that current is not able to flow from the source to the drain region through the channel region when no voltage is applied to the gate electrode. The gate electrode may be isolated from the epitaxial layer by an oxide layer.

The drain region may comprise a drain contact region and a drain extension region extending from the drain contact region towards the channel region. The drain contact region may be electrically connected via a drain contact to a stack of one or more metal interconnect layers comprised in a drain finger. The drain contact region may be electrically connected via any number of drain contacts running along the length of the drain finger to the stack of one or more metal interconnect layers. A metal interconnect layer is a layer above the substrate and isolated from the substrate by one or more layers of oxide in which metal lines are used for connecting elements of the integrated circuit (IC) comprising the LDMOS transistor. The drain finger may comprise an elongated strip of metal on a metal interconnect layer. The drain finger may also comprise more than one elongated strip of metal, each of which elongated strips of metal may be parallel, on top of each other and on different metal interconnect layers. The drain finger may comprise vias connecting one or more different metal interconnect layers. The drain contact region may extend below and along the drain finger. It may be that the drain finger only extends over the drain contact region and not over the drain extension region. It is to be understood that when the drain finger extends over the drain contact region, a projection of the drain finger on the epitaxial layer would cover the drain contact region. The epitaxial layer comprises the drain contact region.

The gate electrode may comprise an elongated strip on the epitaxial layer, isolated from the epitaxial layer by oxide and parallel to the strip comprised in the drain finger. The LDMOS transistor may further comprise a gate field plate, which gate field plate comprises a thick dielectric layer and overlaps the gate electrode.

The tip of the drain finger may be the end of the elongated strip of metal on a metal interconnect layer comprised by the drain finger. The field plate may be adapted to result in a more balanced distribution of the electric field between the drain and the substrate. The drain may comprise the drain finger and the drain region. The magnitude of the electric field may be the absolute value of the electric field. The field plate may be adapted to result in a lower absolute value of the electric field of the highest absolute value of the electric field between the drain and the substrate than the highest absolute value of the electric field between the drain and the substrate without the field plate. The field plate may be adapted to result in a higher breakdown voltage for a local breakdown between the drain and the substrate than the breakdown voltage between the drain and the substrate for a local breakdown without the field plate. The field plate may be adapted to result in a breakdown voltage between the drain and the substrate which causes a breakdown between the drain and the substrate along the length of the drain finger. Thus the field plate may be adapted to improve the ruggedness of the LDMOS transistor by ensuring that a breakdown occurs between the drain and the substrate along the length of the drain finger without a previous local breakdown. This has the technical effect that when the breakdown between the drain and the substrate occurs along the length of the drain finger a larger current will result and more electrical energy can be sunk across the drain to substrate junction.

In an exemplary embodiment of the invention, the field plate comprises a planar metal shield. The planar metal shield may extend over the drain extension region. It may be that the planar metal shield does not extend along the length of the drain finger. The planar metal shield may be formed at the tip of the drain finger. Having the field plate comprise a planar metal shield has the technical effect that the relative orientation of the capacitive plates formed by the planar metal shield and the substrate is optimally aligned for reducing the breakdown voltage for a local breakdown at the drain finger in the neighborhood of the planar metal shield.

In an exemplary embodiment of the invention, the planar metal shield is on a metal interconnect layer comprised in the stack of one or more metal interconnect layers comprised in the drain finger. This has the technical effect that the breakdown voltage for a local breakdown at the tip of the drain finger can be increased relative to a hard breakdown voltage without needing to introduce an additional process step in the production of the LDMOS transistor.

In an exemplary embodiment of the invention, the stack of metal interconnect layers is a mushroom stack of metal interconnect layers and the highest metal interconnect layer comprised in the stack of one or more metal interconnect layers comprised in the drain finger extends over the planar metal shield. A mushroom stack of metal interconnect layers may be a stack of metal interconnect layers wherein the highest metal interconnect layer comprised in the stack of metal interconnect layers extends over the lower metal interconnect layers comprised in the stack of metal interconnect layers. It is to be understood that when the highest metal interconnect layer extends over the lower metal interconnect layers, then a projection of the highest metal interconnect layer on the lower metal interconnect layers would cover each metal interconnect layer. It is further to be understood that if the highest metal interconnect layer comprised in the stack of one or more metal interconnect layers comprised in the drain finger extends over the drain contact region, a projection of the drain finger on the epitaxial layer will cover the drain contact region.

In an exemplary embodiment of the invention, the field plate comprises a round edge at the tip of the drain finger. The field plate may comprise the end of an elongated strip of metal on a metal interconnect layer comprised by the drain finger. The end of the elongated strip of metal in a metal interconnect layer comprised by the drain finger may comprise round edges when viewed in topview. Correspondingly, it may be that the field plate at the tip of the drain finger does not comprise sharp edges when viewed in topview. This has the technical effect of lowering the maximum value of the magnitude of the electrical field by avoiding the extreme values of the electrical field which are prone to occur around sharp edges of a field plate.

In an exemplary embodiment of the invention a tip of the field plate comprises a drop-shaped horizontal projection at the tip of the drain finger. The horizontal projection of the field plate may be a projection of the field plate on the epitaxial layer. A tip of the field plate may comprise a drop-shaped horizontal projection at the tip of an elongated strip of metal. A drop-shaped horizontal projection at the tip of an elongated strip of metal may comprise a curved tip which is wider at the rounded end than at the transition of the curve into the elongated strip of metal. Having a tip of the field plate comprise a drop-shaped horizontal projection at the tip of the drain finger has the technical effect of providing a near-optimal lowering of the maximum value of the magnitude of the electrical field at the tip of the field plate by distributing the electrical field more evenly around a perimeter of the field plate.

In an exemplary embodiment of the invention the tip of the drain finger comprises a second field plate adapted to reduce the maximum of the electric field between the drain and the substrate. The second field plate may be separated from the epitaxial layer by a Tetraethyl orthosilicate (TEOS) field oxide. The second field plate may comprise Tungsten. In particular, the second field plate may consist of Tungsten. The second field may also comprise polysilicon or another material.

In an exemplary embodiment of the invention, the second field plate is isolated from the drain region in the vicinity of the tip of the drain finger. The second field plate may be only formed in the vicinity of the tip of the drain finger. The second field plate may be connected to a metal interconnect layer comprised in the stack of one or more metal interconnect layers. The vicinity of the tip of the drain finger may correspond to the distance of up to ten vias which would otherwise connect the second field plate with the drain region. Having the second field plate not be connected to the drain region in the vicinity of the tip of the drain finger has the technical effect of creating an additional electrical field between the second field plate and the drain region.

In an exemplary embodiment of the invention the second field plate comprises a second planar metal shield. The second planar metal shield may extend over the drain extension region. It may be that the second planar metal shield does not extend along the length of the drain finger. It may be that the second planar metal shield is only formed at the tip of the drain finger. The second planar metal shield may be formed near the tip of the drain finger. Having the second field plate comprise a second planar metal shield has the technical effect that also the relative orientation of the additional capacitive plate formed by the second planar metal is optimally aligned for reducing the breakdown voltage for a local breakdown at the drain finger in the neighborhood of the second planar metal shield.

In an exemplary embodiment of the invention, the second planar metal shield is arranged between the lowest metal interconnect layer of the stack of metal interconnect layers comprised in the drain fingers and the epitaxial layer and separated from the lowest metal interconnect layer by a layer of oxide. The second planar metal shield may also be separated from the lowest metal interconnect layer by a layer of tetraethyl orthosilicate (TEOS). The second planar metal shield may be separated from the lowest metal interconnect layer by a layer of silicon dioxide ($SiO_2$).

DETAILED DESCRIPTION OF THE INVENTION

Figure 1:
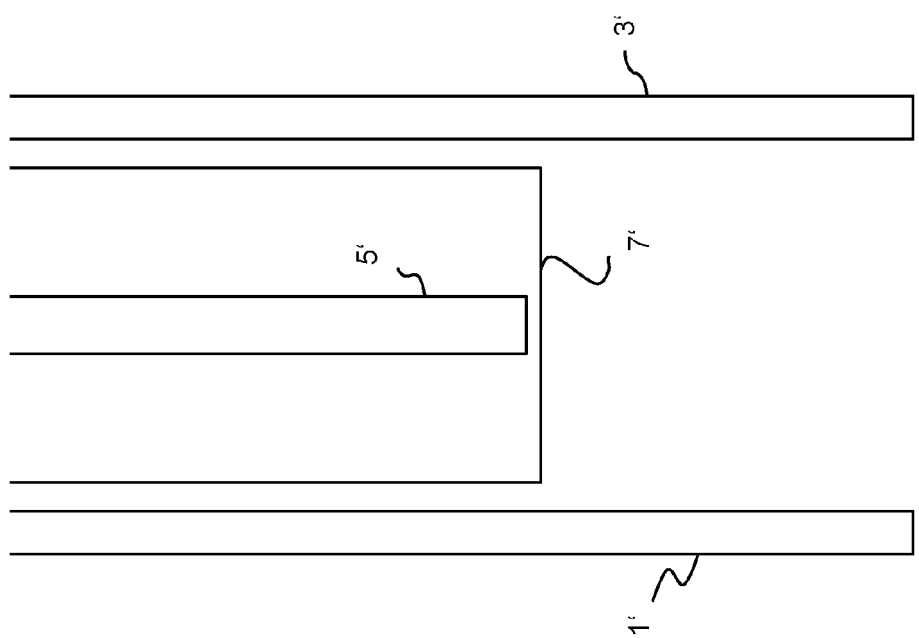
FIG. 1 is a schematic diagram illustrating a topview of a drain finger comprising a stack of metal interconnect layers according to prior art.

FIG. 1 illustrates a topview of a drain finger comprising a stack of metal interconnect layers of an RF-LDMOS according to the prior art. A drain finger comprising a stack of metal interconnect layers with strips 5', 7' as well as two gate electrodes 1', 3' are depicted. The stack of metal interconnect layers comprises a first strip 5' on a first metal interconnect layer which is a lower metal interconnect layer of the stack of metal interconnect layers and a second strip 7' on a second metal interconnect layer which is the top metal interconnect layer of the stack of metal interconnect layers. The first strip 5' is formed by the metal on the first metal interconnect layer and the second strip 7' is formed by the metal on the second metal interconnect layer. The first strip 5', i.e. the strip on the lower metal interconnect layer, is wholly covered by the second strip 7', i.e. the strip on the higher metal interconnect layer 7'. The first strip 5' and the second strip are 7' connected by vias (not shown). A via is a vertical electrical connection between different metal interconnect layers. There is also a drain region beneath the strips 5', 7' which is also not shown. The substrate forms the underlay beneath the epitaxial layer (also not shown) for the strips 5', 7' and the gate electrodes 1', 3'. The substrate naturally also extends to the parts of the RF-LDMOS not covered by the strips 5', 7' and the gate electrodes 1', 3'. In the RF-LDMOS of which a topview is given in FIG. 1, the source is electrically connected to the substrate. Consequently there may be a potential difference between the substrate and the drain, and therefore between the underlying substrate and the strips 5', 7'. Because the strips 5', 7' are both rectangular shaped at their tip, which also corresponds to the tip of the drain finger, the electrical field may reach a maximum magnitude at or near the corners of the tip of the drain finger. Thus a breakdown in the drain to substrate diode may start locally at the tip of the drain finger, which corresponds to the tip of the strips 5', 7' once the local breakdown voltage is reached. This local breakdown voltage will be lower than the voltage at which a breakdown of the drain to substrate diode along the entire drain finger will occur. The breakdown in the drain to substrate diode which is local will be able to sink less current than a breakdown along the entire drain finger.

Figure 2:
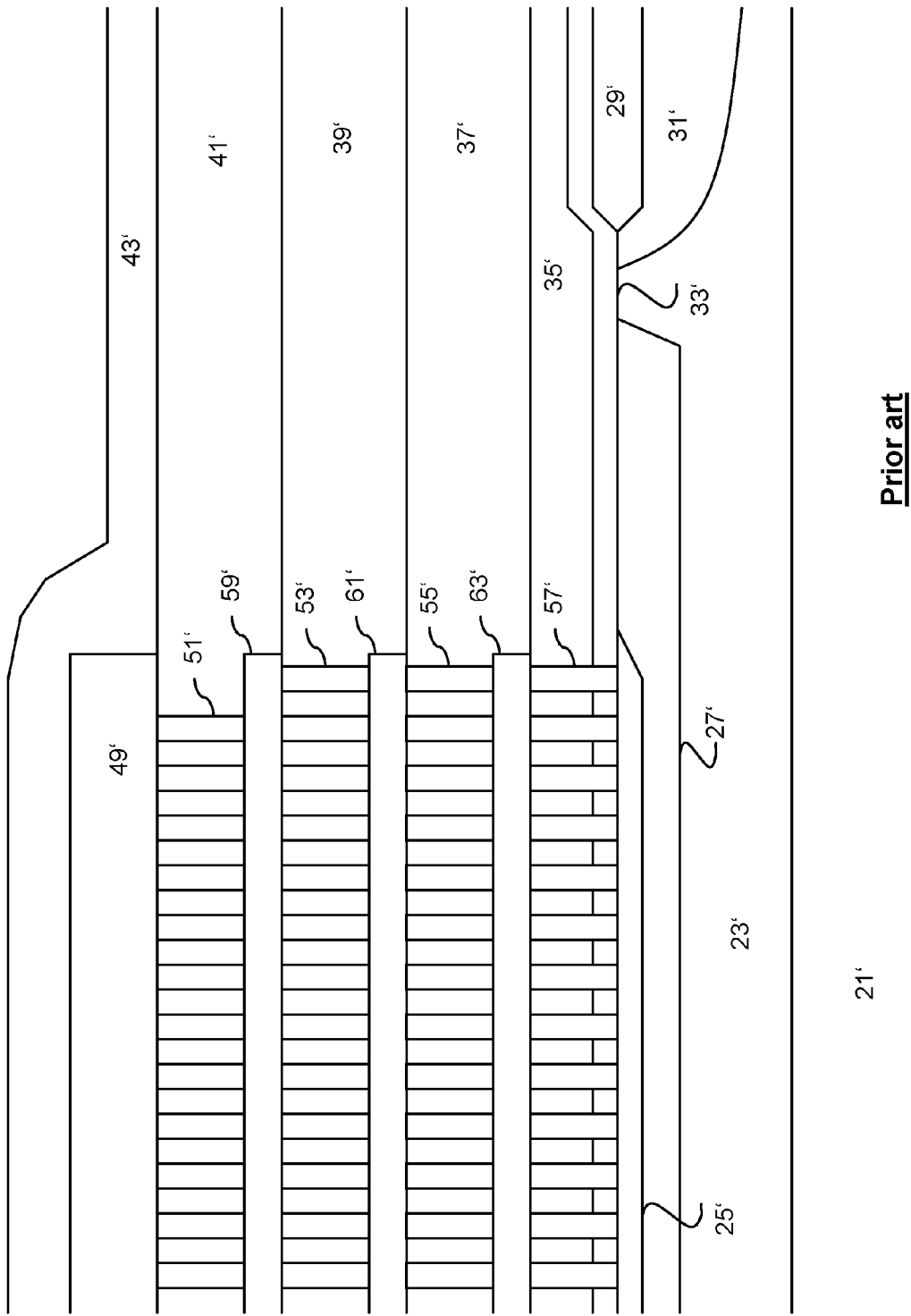
FIG. 2 is a schematic cross section along the length of a drain finger illustrating a drain finger comprising a stack of metal interconnect layers and a drain contact region according to prior art.

FIG. 2 illustrates a schematic cross section of a drain finger of an RF-LDMOS along the length of the drain finger according to the prior art. The schematic cross section is a cross section of the drain finger near the tip of the drain finger. Within a p-type epitaxial layer 23' on a p-type silicon substrate 21' is an n-type drain region 25'. Within the epitaxial layer 23' there is further an n-type drain extension region 27' around the drain region 25'. The drain extension region 27' has a lower doping level, which is a n-type doping level, than the drain region 25' and is optimized for a maximum output power of the illustrated RF-LDMOS transistor. Moreover, within the epitaxial layer 23' there is a channel stop region 31' beyond the tip of the drain finger. Above the channel stop region there is a local oxidation of silicon (LOCOS) region 29'. Above the epitaxial layer 23' is a first TEOS layer 33' and a second TEOS layer 35'.

Above the second TEOS layer 35' there is a first metal feeder bar 63'. The first metal feeder bar 63' may be comprised in the first strip 5' on a first metal interconnect layer as illustrated in FIG. 1. The first metal feeder bar 63' is connected to the drain region 25' through a first set 57' of vias. There is also a third TEOS layer 37' above the second TEOS layer 35'.

Above the third TEOS layer 37' there is a second metal feeder bar 61'. The second metal feeder bar 61' is connected to the first metal feeder bar 63' through a second set 55' of vias. There is also a fourth TEOS layer 39' above the second oxide layer 37'.

Above the fourth TEOS layer 39' there is a third metal feeder bar 59'. The third metal feeder bar 59' is connected to the second metal feeder bar 61' through a third set 53' of vias. There is also a fifth TEOS layer 44' above the fourth TEOS layer 39'.

Above the fifth TEOS layer 41' there is a fourth metal feeder bar 49'. The fourth metal feeder bar 63' may be comprised in the second strip 7' on a second metal interconnect layer as illustrated in FIG. 1. The fourth metal feeder bar 49' is connected to the third metal feeder bar 59' through a fourth set 51' of vias. There is a nitride layer 43' above the fifth TEOS layer 41'.

When a breakdown occurs at a drain finger according to the prior art, it will likely be a drain to substrate breakdown local to a drain finger of the p-n junction formed by the drain region 25' and the drain extension region 27' on the one hand and the epitaxial layer 23' and the substrate 21' on the other hand. FIG. 2 illustrates that in an RF-LDMOS transistor according to the prior art, when there is a potential difference between the drain and the source, which results in a potential difference between the drain and the substrate, the electrical field will be concentrated in the region directly below the drain region 25' and in particular below and near the tip of the drain region 25' which also corresponds to the tip of the metal feeder bars 63', 61', 59' and 49'. There will be a significantly lower electrical field further away from the tip of the drain region 25', for example in the region nearer toward the LOCOS region 29'.

Figure 3:
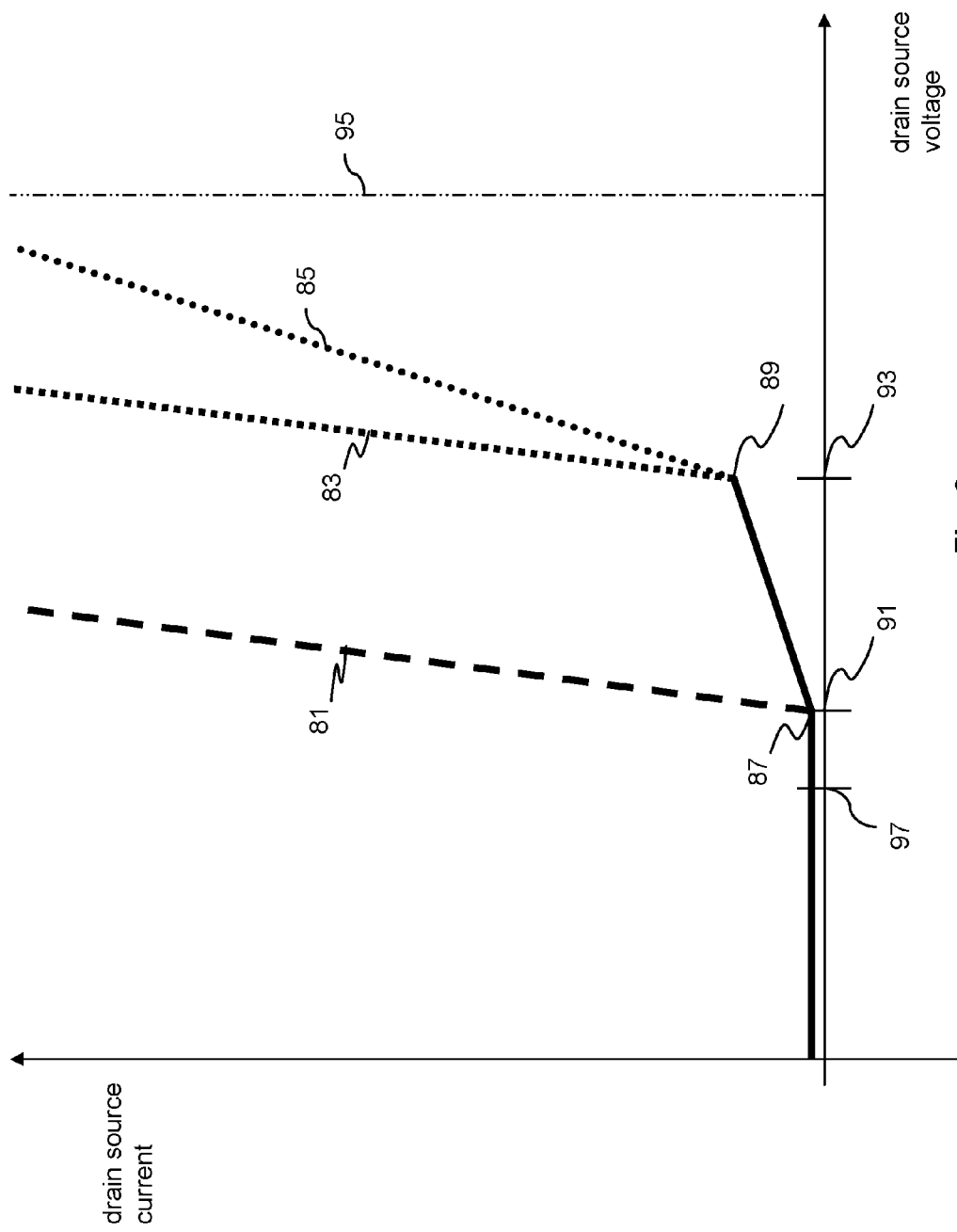
FIG. 3 is a schematic diagram illustrating actual breakdown voltages and currents according to the prior art and desired breakdown voltages and currents.

FIG. 3 illustrates actual breakdown voltages and currents of RF-LDMOS transistors according to the prior art and desired breakdown voltages and currents of RF-LDMOS transistors.

A first graph 83 gives the drain to source current through the substrate of a first RF-LDMOS transistor as a function of the drain to source voltage. A second graph 85 gives the drain to source current through the substrate of a second RF-LDMOS transistor also as a function of the drain to source voltage. Both the first RF-LDMOS transistor and the second RF-LDMOS transistor are structurally similar to the RF-LDMOS transistors illustrated in FIG. 1 and FIG. 2 but differ in that the second RF-LDMOS transistor has a greater length of the drain finger. According to both the first graph 83 and the second graph 85, the breakdown of both the first RF-LDMOS transistor as well as the second RF-LDMOS transistor occurs at a first voltage 91. At position 87 the slope of both the first graph 83 and the second graph 85 increases. Thus at position 87 a local breakdown, for example at the tip of a drain finger, sets in both for the first RF-LDMOS transistor and the second RF-LDMOS transistor.

For both the first RF-LDMOS transistor and the second RF-LDMOS transistor, hard breakdown starts at position 89 of the first graph 83 and the second graph 85, which corresponds to a second voltage 93. Thus at position 89 a breakdown along a larger portion or the entire portion of the length of the drain finger may be understood to occur. Because during hard breakdown the current rises much faster with the voltage, a device may sink significantly more energy during hard breakdown. However, a third voltage 95 is a destructive voltage level at which the device is damaged because at this voltage a parasitic bipolar junction transistor is turned on.

It is desired to lower the voltage at which hard breakdown occurs, so that more current and consequently more energy can be sunk before the destructive third voltage 95 is reached. This would improve the ruggedness of the RF-LDMOS transistor. At the same time, care must be taken that no breakdown occurs below a fourth voltage 97. It is part of the specification of the respective RF-LDMOS transistor that no breakdown is allowed to occur below this fourth voltage 97.

Because the breakdown voltage depends on the thickness of the epitaxial layer, the position 89 of graphs 83, 85 may be moved to a lower voltage, for example to voltage 91, by decreasing the thickness of the epitaxial layer. However, because the voltage at which the local breakdown corresponding to position 87 occurs depends on the thickness of the epitaxial layer in the same way, this would immediately move the position 87 of graphs 83, 85 to a lower voltage as well. This lower voltage may then fall below the fourth voltage 97, resulting in a local breakdown voltage in contravention of the specification of the RF-LDMOS transistor in question.

Thus it is desired to prevent a local breakdown, so that hard breakdown occurs without a prior local breakdown. Then by adjusting the thickness of the epitaxial layer, the position 89 at which hard breakdown occurs may be adjusted. For example, the position 89 may be moved to voltage 91, and a desired graph 81 obtained with a lower voltage for hard breakdown and no local breakdown before the onset of the hard breakdown. In this way the ruggedness of the device would be improved while still conforming to the specification of the device.

Figure 4:
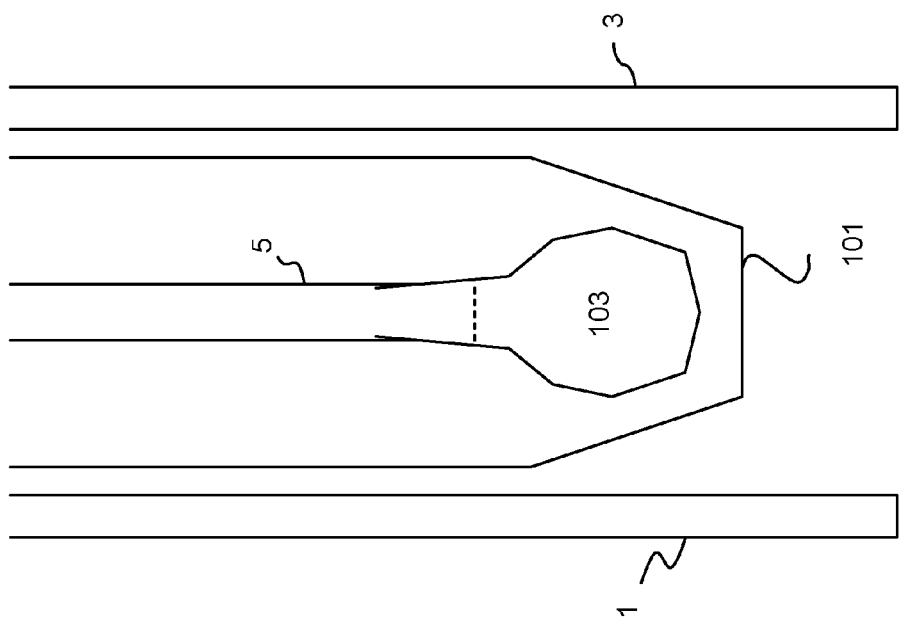
FIG. 4 is a schematic diagram illustrating a topview of an exemplary drain finger comprising a stack of metal interconnect layers according to the present invention.
Figure 5:
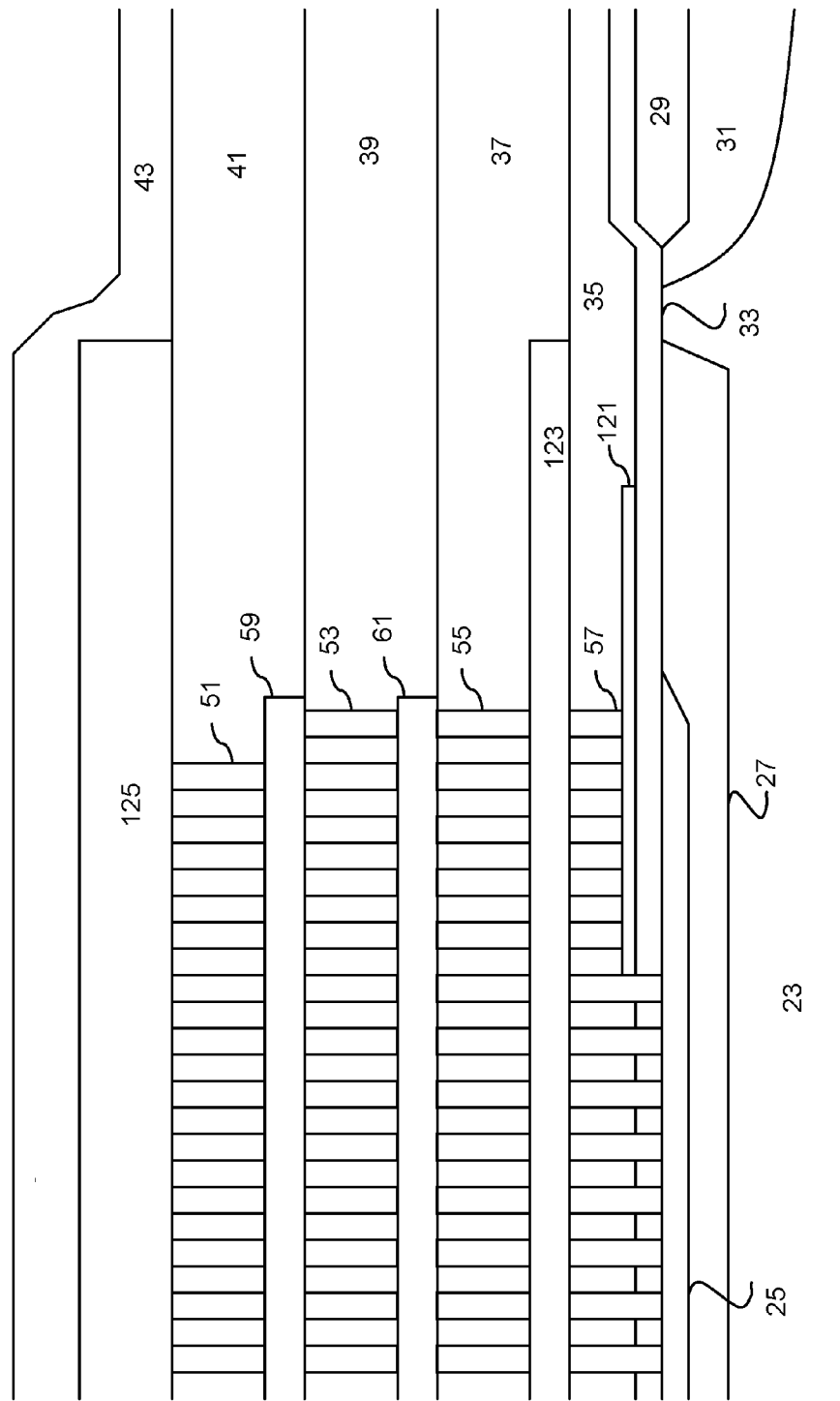
FIG. 5 is a schematic cross section along the length of a drain finger illustrating an exemplary drain finger comprising a stack of metal interconnect layers and a drain contact region according to the present invention.

FIG. 4 and FIG. 5 illustrate an exemplary embodiment of the invention realizing these advantages.

FIG. 4 is a schematic diagram illustrating a topview of a drain finger comprising a stack of metal interconnect layers according to an exemplary embodiment of the present invention. A drain finger comprising a stack of metal interconnect layers with strips 5, 101 as well as two gate electrodes 1, 3 are depicted. The stack of metal interconnect layers comprises a first strip 5 on a first metal interconnect layer which is a lower metal interconnect layer of the stack of metal interconnect layers. The first strip comprises a drop-shaped field plate 103 at its tip. The stack of metal interconnect layers further comprises a second strip 101 on a second metal interconnect layer which is the top metal interconnect layer of the stack of metal interconnect layers. The first strip 5 as well as the drop-shaped field plate 103 is formed by the metal on the first metal interconnect layer. The second strip 101 is formed by the metal on the second metal interconnect layers. The second strip 101 is shaped as to wholly cover the first strip 5 as well as the drop-shaped field plate 103 of the first strip 5. The first strip 5 as well as the field plate 103 and the second strip are 101 connected by vias (not shown). There is also a drain region beneath the strips 5, 101 which is also not shown. The substrate forms the underlay beneath the epitaxial layer (also not shown) for the strips 5, 101 and the gate electrodes 1, 3. The substrate naturally also extends to the parts of the RF-LDMOS not covered by the strips 5, 101 and the gate electrodes 1, 3. In the RF-LDMOS of which a topview is given in FIG. 4, the source is electrically connected to the substrate. Consequently there may be a potential difference between the substrate and the drain, and therefore between the underlying substrate and the strips 5, 101 and naturally between the field plate 103 and the underlying substrate.

Because the field plate 103 of the strip 5 is drop-shaped, the maximum magnitude of the electrical field around the perimeter of the field plate 103 and the strip 5 will be reduced in contrast to the maximum magnitude of the corresponding electrical field of the RF-LDMOS transistor as shown in FIG. 1, because the tip is the region of the strip 5 in which a maximum magnitude of the electrical field can be expected. The cone shaped tip of the strip 101 in FIG. 4 enhances this effect. Because the occurrence of a breakdown depends on the occurring maximum of the magnitude of the electrical field, the field plate 103 may be shaped so as to ensure that a breakdown at the tip of the drain finger occurs only at the same voltage as a breakdown along the entire drain finger. Thus, the desired effect in FIG. 3 in which the breakdown starts with a breakdown without prior local breakdowns may be achieved.

FIG. 5 illustrates a schematic cross section along the length of a drain finger of an RF-LDMOS according to an exemplary embodiment of the invention. The schematic cross section is a cross section of the drain finger near the tip of the drain finger. The schematic cross section may be a cross section of a drain finger as illustrated in FIG. 4. Within a p-type epitaxial layer 23 on a p-type silicon substrate 21 is an n-type drain region 25. Within the epitaxial layer 23 there is further an n-type drain extension region 27 around the drain region 25. The drain extension region 27 has a lower doping level, which is a n-type doping level, than the drain region 25 and is optimized for a maximum output power of the illustrated RF-LDMOS transistor. Moreover, within the epitaxial layer 23 there is a channel stop region 31 beyond the tip of the drain finger. Above the channel stop region there is a LOCOS region. Above the epitaxial layer 23 is a first TEOS layer 33 and a second TEOS layer 35.

Within the second TEOS layer 35 there is further a tungsten shield 121 covering parts of the drain region 25 as well as parts of the surrounding drain extension region 27.

Above the second TEOS layer 35 there is a first metal feeder bar forming a first metal shield 123. The first metal shield 123 may be comprised in the field plate 103 on a first metal interconnect layer as illustrated in FIG. 4. The first metal shield 123 is connected to the drain region 25 as well as to the tungsten shield 121 through a first set 57 of vias. The vias 57 run along the length of the drain finger and thus along the length of the first metal shield 123. From the point at which the tungsten shield 121 is formed below the first metal shield 123, the vias 57 only connect the first metal shield 121 with the tungsten shield 121. Thus, the vias 57 in closer proximity to the tip of the drain region 25 connect the first metal shield 123 to the tungsten shield 121, but do not connect these two entities with the drain region 25. Consequently an electric field is created in the region between the tungsten shield 121 and the drain region 25 as well as the drain region 27 near the tip of the drain finger where the tungsten shield 121 is not connected through vias 57 with the drain region 25. The creation of the electric field reduces the maximum magnitude of the electric field occurring near the tip of the drain finger, because the electric field is distributed over a larger volume. The metal shield 123 covers the drain region 25 as well as the drain extension region 27. There is also a third TEOS layer 37 above the second TEOS layer 35.

Above the third TEOS layer 37 there is a second metal feeder bar 61. The second metal feeder bar 61 is connected to the first metal feeder bar 63 through a second set 55 of vias. There is also a fourth TEOS layer 39 above the third TEOS layer 37.

Above the fourth TEOS layer 39 there is a third metal feeder bar 59. The third metal feeder bar 59 is connected to the second metal feeder bar 61 through a third set 53 of vias. There is also a fifth TEOS layer 41 above the fourth TEOS layer 39.

Above the fifth TEOS layer 41 there is a second metal shield 125. The second metal shield 125 may be comprised in the second strip 101 on a second metal interconnect layer as illustrated in FIG. 4. The second metal shield 125 is connected to the third metal feeder bar 59 through a fourth set 51 of vias. There is a nitride layer 43 above the second metal shield 125.

In contrast to the prior art illustrated in FIG. 2, the tungsten shield 121, the first metal shield 123 and the second metal shield 125 result in a distribution of the electrical field between the drain and the substrate which does not lead to peak values because all the metal feeder bars 49, 59, 61, 63 do not have their edge aligned over each other as they do in FIG. 2. The electrical field created between the metal shields 123, 125 and the tungsten shield 121 as well as between them and the substrate region results in the electrical field being distributed over a larger volume and thus being reduced in maximum magnitude. Thus for any given potential difference between the drain and the source, the maximum of the magnitude of the electrical field occurring between the drain and the source will be reduced when compared to the situation illustrated in FIG. 2. Because, as was already stated, the occurrence of a breakdown depends on the occurring maximum of the magnitude of the electrical field, the tungsten shield 121, the first metal shield 123 and the second metal shield 125 may be arranged such as to ensure that a breakdown at the tip of the drain finger occurs only at the same voltage as a breakdown along the entire drain finger. Thus, the desired effect in FIG. 3 in which the breakdown starts with a breakdown without prior local breakdowns may be achieved.

The invention claimed is:

1. A laterally diffused metal oxide semiconductor transistor for a radio frequency power amplifier comprising:
    a substrate having a drain region; and
    a drain finger comprising
    a stack of at least one metal interconnect layer and
    a tip, wherein a metal interconnect layer of the stack of the at least one metal interconnect layer is connected to the drain region on the substrate, and the tip of the drain finger includes a field plate that reduces a maximum magnitude of an electric field between the drain region and the substrate.

2. The laterally diffused metal oxide semiconductor transistor according to claim 1, wherein the field plate comprises a planar metal shield.

3. The laterally diffused metal oxide semiconductor transistor according to claim 2, wherein the planar metal shield is on a metal interconnect layer in the stack of the at least one metal interconnect layer in the drain finger.

4. The laterally diffused metal oxide semiconductor transistor according to claim 2, wherein the stack of the at least one metal interconnect layer is a mushroom stack of at least two metal interconnect layers and wherein a highest metal interconnect layer in the stack of the at least two metal interconnect layers in the drain finger extends over the planar metal shield.

5. The laterally diffused metal oxide semiconductor transistor according to claim 1, wherein the field plate has a round edge at the tip of the drain finger.

6. The laterally diffused metal oxide semiconductor transistor according to claim 5, wherein a tip of the field plate includes a drop-shaped horizontal projection at the tip of the drain finger.

7. The laterally diffused metal oxide semiconductor transistor according to claim 1, wherein the tip of the drain finger includes a second field plate that reduces the maximum magnitude of the electric field between the drain region and the substrate.

8. The laterally diffused metal oxide semiconductor according to claim 7, wherein the second field plate is isolated from the drain region in a vicinity of the tip of the drain finger.

9. The laterally diffused metal oxide semiconductor transistor according to claim 7, wherein the second field plate comprises a second planar metal shield.

10. The laterally diffused metal oxide semiconductor transistor according to claim 9, wherein the second planar metal shield is arranged between a lowest metal interconnect layer of the stack of metal interconnect layers comprised in the drain finger and an epitaxial layer and is separated from the lowest metal interconnect layer by a layer of oxide.

11. The laterally diffused metal oxide semiconductor transistor according to claim 7, wherein the second field plate contains tungsten.

12. A power amplifier comprising the laterally diffused metal oxide semiconductor transistor according to claim 1.

13. A base station, comprising the laterally diffused metal oxide semiconductor transistor according to claim 1.

14. The laterally diffused metal oxide semiconductor transistor according to claim 1, wherein the tip of the drain finger is cone shaped.

15. The laterally diffused metal oxide semiconductor transistor according to claim 1, wherein a breakdown at the tip of the drain finger occurs only at a substantially identical voltage as a breakdown along all of the drain finger.

* * * * *